(12) United States Patent
Dai et al.

(10) Patent No.: US 9,977,151 B2
(45) Date of Patent: May 22, 2018

(54) LIGHT DIFFUSION MEMBER, AND LIGHT EMITTING DEVICE, AND DISPLAY DEVICE USING THE SAME

(71) Applicant: Scienbizip Consulting (ShenZhen) Co., Ltd., Shenzhen (CN)

(72) Inventors: Feng-Yuen Dai, New Taipei (TW); Chau-Jin Hu, Tu-Cheng (TW); Yung-Lun Huang, Tu-Cheng (TW); Li-Ying Wang He, New Taipei (TW)

(73) Assignee: ScienBiziP Consulting (Shenzhen) Co., Ltd., Shenzhen (CN)

( * ) Notice: Subject to any disclaimer, the term of this patent is extended or adjusted under 35 U.S.C. 154(b) by 470 days.

(21) Appl. No.: 14/755,191

(22) Filed: Jun. 30, 2015

(65) Prior Publication Data
US 2016/0084472 A1 Mar. 24, 2016

(30) Foreign Application Priority Data
Sep. 19, 2014 (TW) .............................. 103132378 A

(51) Int. Cl.
| | |
|---|---|
| H01L 29/227 | (2006.01) |
| G02B 3/00 | (2006.01) |
| G02B 5/02 | (2006.01) |
| H01L 33/56 | (2010.01) |
| H01L 33/50 | (2010.01) |
| H01L 33/54 | (2010.01) |
| G02F 1/1335 | (2006.01) |
| H01L 33/58 | (2010.01) |

(52) U.S. Cl.
CPC ............ *G02B 3/00* (2013.01); *G02B 5/0236* (2013.01); *G02B 5/0242* (2013.01); *G02F 1/133606* (2013.01); *H01L 33/501* (2013.01); *H01L 33/54* (2013.01); *H01L 33/56* (2013.01); *G02F 1/133603* (2013.01); *G02F 2001/133614* (2013.01); *G02F 2202/36* (2013.01); *H01L 33/58* (2013.01); *H01L 2933/0091* (2013.01)

(58) Field of Classification Search
CPC ....... H01L 33/501; H01L 33/54; H01L 33/56; H01L 33/58; G02B 5/02; G02B 5/0236; G02B 5/0242; G02F 1/133606
USPC ...................................... 257/88, 98
See application file for complete search history.

(56) References Cited

U.S. PATENT DOCUMENTS

| | | | | |
|---|---|---|---|---|
| 2013/0292710 | A1* | 11/2013 | Kim ......................... | H01L 33/50 257/88 |
| 2015/0028365 | A1* | 1/2015 | Kurtin .................... | H01L 33/501 257/88 |

(Continued)

FOREIGN PATENT DOCUMENTS

| | | | |
|---|---|---|---|
| CN | 102186643 A | | 9/2011 |
| CN | 102280565 A | | 12/2011 |

(Continued)

*Primary Examiner* — Matthew E Warren
(74) *Attorney, Agent, or Firm* — ScienBiziP, P.C.

(57) ABSTRACT

A light diffusion member includes a matrix and a number of quantum dots uniformly dispersed in the matrix. The matrix is made of epoxy resin and ammonium persulfate. The quantum dots have a mass percentage of about 10% to about 20% of the total mass of the light diffusion member. A light emitting device using the light diffusion member and a display device using the light emitting device are also provided.

18 Claims, 4 Drawing Sheets

(56) References Cited

U.S. PATENT DOCUMENTS

2015/0236221 A1* 8/2015 Deak, Sr. ............... C08G 18/10
　　　　　　　　　　　　　　　　　　　　　315/185 R
2016/0163934 A1* 6/2016 Peddada ............. H01L 33/0095
　　　　　　　　　　　　　　　　　　　　　438/27

FOREIGN PATENT DOCUMENTS

| CN | 102186643 B | 5/2014 |
| CN | 103900023 A | 7/2014 |

* cited by examiner

LIGHT DIFFUSION MEMBER, AND LIGHT EMITTING DEVICE, AND DISPLAY DEVICE USING THE SAME

FIELD

The subject matter generally relates to a light diffusion member, a light emitting device using the light diffusion member, and a display device using the light emitting device.

BACKGROUND

Light emitting devices usually include white light emitting diodes (LEDs) and light diffusion members covering the white LEDs. When in use, light emitted by the white LED can pass through the light diffusion member and then be diffused. Typically, such a light diffusion member includes a matrix made of polycarbonate (PC) or polymethylmethacrylate (PMMA) with diffusion particles dispersed in the matrix.

BRIEF DESCRIPTION OF THE DRAWINGS

Implementations of the present technology will now be described, by way of example only, with reference to the attached figures.

DETAILED DESCRIPTION

Figure 1:
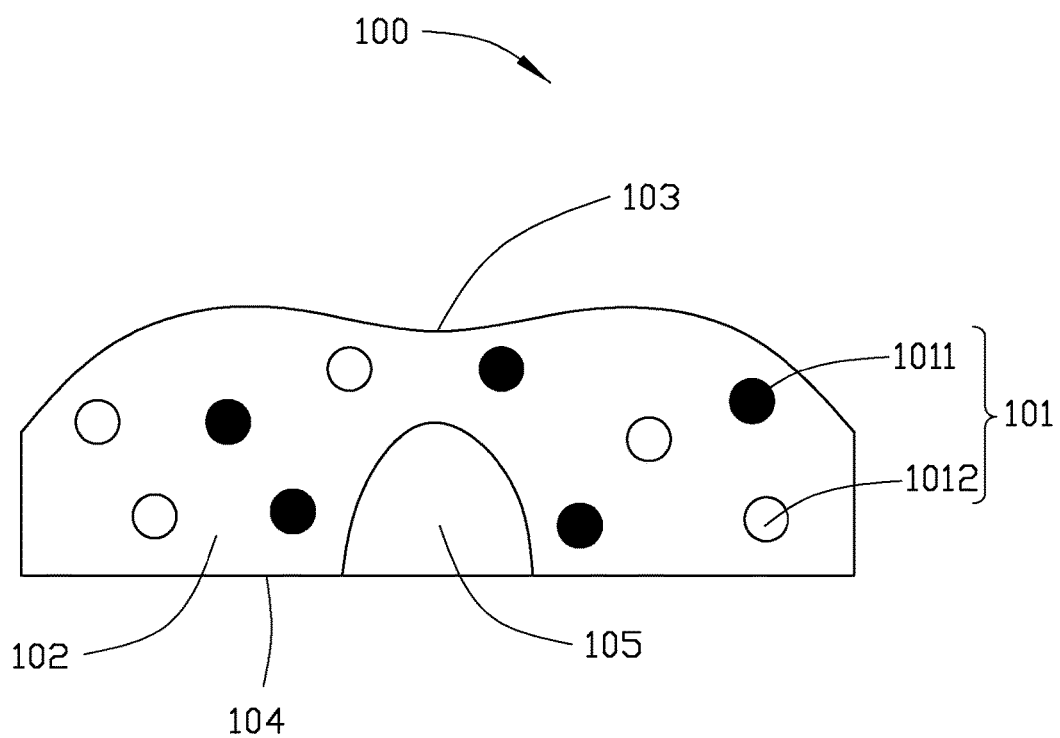
FIG. 1 is a diagrammatic view of a light diffusion member.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 illustrates an embodiment of a light diffusion member 100. The light diffusion member 100 includes a matrix 102 and a number of quantum dots 101 uniformly dispersed in the matrix 102. The matrix 102 is made of epoxy resin and ammonium persulfate. The epoxy resin has a mass percentage of about 10% to about 15% of the total mass of the light diffusion member 100. The ammonium persulfate has a mass percentage of about 65% to about 80% of the total mass of the light diffusion member 100. The quantum dots 101 have a mass percentage of about 10% to about 20% of the total mass of the light diffusion member 100. The quantum dots 101 include red quantum dots 1011 and green quantum dots 1012. As used herein, the term "green quantum dots" refers to quantum dots that emit light in the green region of the visible spectrum when excited. Likewise, "red quantum dots" refers to quantum dots that emit red light, and so on. The red quantum dots 1011 and the green quantum dots 1012 are in a weight ratio of about 1:1.

When in use, the light diffusion member 100 is covered on a light source 202 (shown in FIG. 2) which can emit white light towards the light diffusion member 100. When the white light passes through the light diffusion member 100, the red quantum dots 1011 and the green quantum dots 1012 are excited by blue light included in the white light, to emit red light and green light, respectively. Thus, the light diffused by the light diffusion member 100 including more red light, green light, a color rendering property and color gamut of the light diffused, is improved.

In at least one embodiment, the matrix 102 includes a diffusion surface 103 and a surface 104 opposite to the diffusion surface 103. The surface 104 defines a receiving groove 105 for receiving the light source 202. The diffusion surface 103 is curved to be capable of diffusing the white light passing through the matrix 102.

The light diffusion member 100 can further include a protection layer (not shown) covering the diffusion surface 103, to prevent oxide and water-vapor from entering the light diffusion member 100. As such, a good luminous efficiency of the quantum dots 101 can be maintained. The protection layer may be a waterproof or low water permeable polymer film or an ultrathin glass film.

Figure 2:
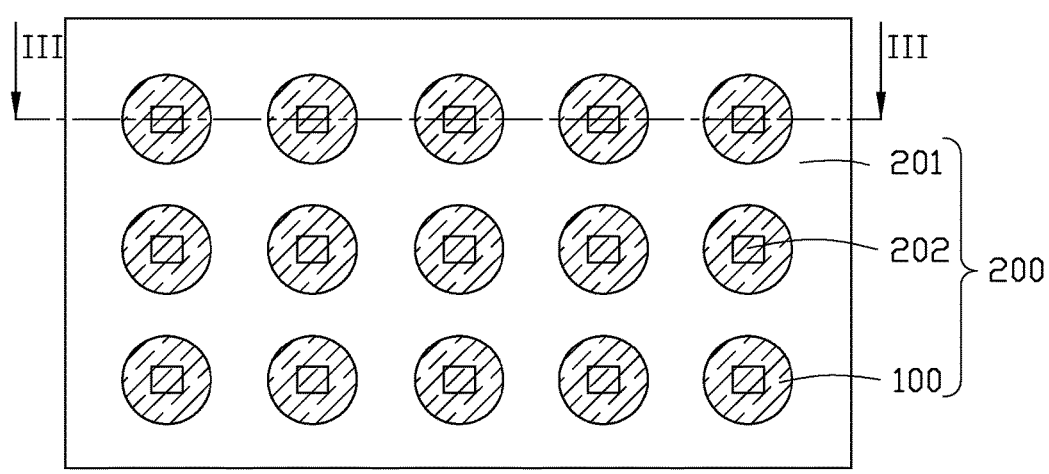
FIG. 2 is a diagrammatic view of a light emitting device using the light diffusion member of FIG. 1.

In at least one embodiment, the matrix 102 has a irregular shape (shown in FIG. 1 and FIG. 2). In other embodiments, the shape of the matrix 102 can be varied.

Figure 3:
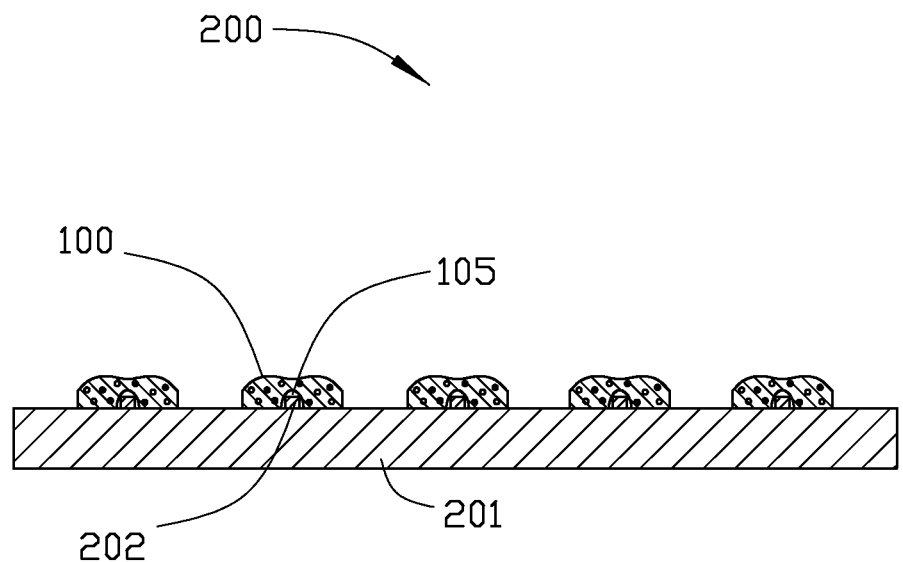
FIG. 3 is a cross-sectional view taken along line III-III of FIG. 2.

FIG. 2 and FIG. 3 illustrate an embodiment of a light emitting device 200 including at least one light diffusion member 100. The light emitting device 200 may be a backlight module of a display device (such as liquid crystal display), a lighting device (such as flat panel lighting device) in a display device, or an outdoor lighting equipment (such as street lamp, electro optic logo). The light emitting device 200 includes a substrate 201 electrically connected with a power source (not shown), such as a battery, at least one light source 202 positioned on and electrically connected with the substrate 201, at least one light diffusion member 100, and a control circuit (not shown) electrically connected with the substrate 201 and the light source 202. Each light diffusion member 100 is covered on one light source 202, and the light source 202 is received in the receiving groove 105 of the corresponding light diffusion member 100. The control circuit is configured to electrically connect or disconnect the light source 202 to the substrate 201, thereby allowing the power source to power on or power off the light source 202. In at least one embodiment, the substrate 201 is a print circuit board (PCB). The light source 202 is a LED module capable of emitting white light.

When the light emitting device 200 is used as a lighting device, the light emitting device 200 can further include a transparent casing (not shown) for receiving the light emitting device 200.

Figure 4:
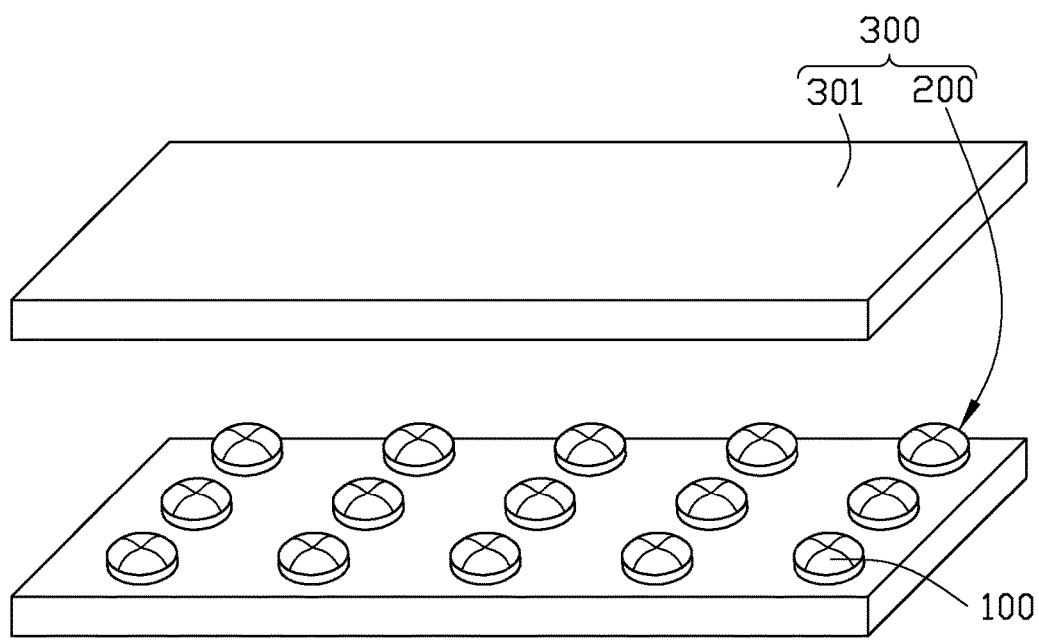
FIG. 4 is an isometric view of a display device using the light emitting device of FIG. 2.

FIG. 4 illustrates an embodiment of a display device 300 including the light emitting device 200, and a display panel 301 located above the diffusion surface 103 of the light diffusion member 100 included in the light emitting device 200. The light diffused by the light diffusion member 100 passes through the display panel 301. In this embodiment, the light emitting device 200 is backlight module.

The embodiments shown and described above are only examples. Even though numerous characteristics and advantages of the present technology have been set forth in the foregoing description, together with details of the structure and function of the present disclosure, the disclosure is illustrative only, and changes can be made in the detail, including in matters of shape, size and arrangement of the parts within the principles of the present disclosure up to, and including, the full extent established by the broad general meaning of the terms used in the claims.

What is claimed is:

1. A light diffusion member comprising:
    a matrix comprised of epoxy resin and ammonium persulfate; and
    a plurality of quantum dots dispersed in the matrix;
    wherein the quantum dots have a mass percentage of about 10% to about 20% of the total mass of the light diffusion member.

2. The light diffusion member of claim 1, wherein the epoxy resin has a mass percentage of about 10% to about 15% of the total mass of the light diffusion member, the ammonium persulfate has a mass percentage of about 65% to about 80% of the total mass of the light diffusion member.

3. The light diffusion member of claim 1, wherein the quantum dots comprise red quantum dots and green quantum dots.

4. The light diffusion member of claim 3, wherein the red quantum dots and the green quantum dots are in a weight ratio of about 1:1.

5. The light diffusion member of claim 1, wherein the matrix of the light diffusion member comprises a diffusion surface and a surface opposite to the diffusion surface; the surface defines a receiving groove for receiving a light source; the diffusion surface is configured to diffuse light emitted by the light source.

6. The light diffusion member of claim 5, wherein the diffusion surface is curved.

7. A light emitting device comprising:
    a substrate; and
    at least one light source positioned on and electrically connected with the substrate; and
    at least one light diffusion member covered on at least one light source, each light diffusion member comprising:
    a matrix comprised of epoxy resin and ammonium persulfate; and
    a plurality of quantum dots dispersed in the matrix;
    wherein the quantum dots have a mass percentage of about 10% to about 20% of the total mass of the light diffusion member.

8. The light emitting device of claim 7, wherein the epoxy resin has a mass percentage of about 10% to about 15% of the total mass of the light diffusion member, the ammonium persulfate has a mass percentage of about 65% to about 80% of the total mass of the light diffusion member.

9. The light emitting device of claim 7, wherein the quantum dots comprise red quantum dots and green quantum dots.

10. The light emitting device of claim 9, wherein the red quantum dots and the green quantum dots are in a weight ratio of about 1:1.

11. The light emitting device of claim 7, wherein the matrix of the light diffusion member comprises a diffusion surface and a surface opposite to the diffusion surface; the surface defines a receiving groove for receiving a light source; the diffusion surface is configured to diffuse light emitted by the light source.

12. The light emitting device of claim 11, wherein the diffusion surface is curved.

13. A display device comprising:
    a display panel; and
    a light emitting device facing the display, the light emitting device comprising:
    a substrate; and
    at least one light source positioned on and electrically connected with the substrate; and
    at least one light diffusion member covered on at least one light source, each light diffusion member comprising:
    a matrix comprised of epoxy resin and ammonium persulfate; and
    a plurality of quantum dots dispersed in the matrix;
    wherein the quantum dots have a mass percentage of about 10% to about 20% of the total mass of the light diffusion member.

14. The display device of claim 13, wherein the epoxy resin has a mass percentage of about 10% to about 15% of the total mass of the light diffusion member, the ammonium persulfate has a mass percentage of about 65% to about 80% of the total mass of the light diffusion member.

15. The display device of claim 13, wherein the quantum dots comprise red quantum dots and green quantum dots.

16. The display device of claim 15, wherein the red quantum dots and the green quantum dots are in a weight ratio of about 1:1.

17. The display device of claim 13, wherein the matrix of the light diffusion member comprises a diffusion surface and a surface opposite to the diffusion surface; the surface defines a receiving groove for receiving a light source; the diffusion surface is configured to diffuse light emitted by the light source.

18. The display device of claim 17, wherein the diffusion surface is curved.

* * * * *